United States Patent [19]
Takenouchi et al.

[11] Patent Number: 5,427,961
[45] Date of Patent: Jun. 27, 1995

[54] SEMICONDUCTOR DEVICE AND METHOD FOR FORMING THE SAME

[75] Inventors: Akemi Takenouchi; Makoto Hosokawa; Yasuyuki Arai; Setsuo Nakajima, all of Kanagawa, Japan

[73] Assignee: Semiconductor Energy Laboratory Co., Ltd., Kanagawa, Japan

[21] Appl. No.: 19,849

[22] Filed: Feb. 19, 1993

[30] Foreign Application Priority Data

Feb. 21, 1992 [JP] Japan .................. 4-072491

[51] Int. Cl.⁶ .............................................. H01L 31/00
[52] U.S. Cl. .................................. 437/2; 136/251; 136/256; 437/181
[58] Field of Search .................. 437/1, 2, 3; 136/251

[56] References Cited

U.S. PATENT DOCUMENTS

| | | | |
|---|---|---|---|
| 4,356,374 | 10/1982 | Noyori et al. | 437/203 |
| 4,639,277 | 6/1987 | Hawkins | 437/1 |
| 4,680,855 | 7/1987 | Yamazaki et al. | 437/2 |
| 4,681,654 | 7/1987 | Clementi et al. | 437/1 |
| 4,816,324 | 3/1989 | Berman | 437/5 |
| 4,968,372 | 11/1990 | Maass | 437/2 |
| 5,069,727 | 12/1991 | Kouzuma et al. | 437/2 |
| 5,152,805 | 10/1992 | Geddes et al. | 437/1 |
| 5,215,598 | 6/1993 | Kouzuma et al. | 437/2 |
| 5,268,037 | 12/1993 | Glatfelter | 136/256 |

OTHER PUBLICATIONS

Hawley, G., *The Condensed Chemical Period:* 9th edition. Van Nostrand Reinhold Company,. N.Y., 1977, p. 14,699.

Wolf, S., et al, *Silicon Processing for the VLSI Era vol. 1 Process Technology*, Lattice Press 1986 p. 335.

*Primary Examiner*—Olik Chaudhuri
*Assistant Examiner*—S. Mulpuri
*Attorney, Agent, or Firm*—Sixbey, Friedman, Leedom & Ferguson; Gerald J. Ferguson, Jr.; Stuart J. Friedman

[57] ABSTRACT

A semiconductor device using an organic resin substrate, wherein an organic resin coating is provided on the surface of said organic resin substrate and a method for forming the same.

18 Claims, 2 Drawing Sheets

SEMICONDUCTOR DEVICE AND METHOD FOR FORMING THE SAME

BACKGROUND OF THE INVENTION

1. Field of the Invention

The present invention relates to a semiconductor device using a substrate having flexibility, more specifically, it relates to a semiconductor device using an organic resin substrate.

2. Prior Art

Conventionally known are thin film solar cells using a flexible organic resin film (also called as a plastic film) as a substrate.

Those thin film solar cells using flexible substrates have a larger field of application and can be more easily handled as compared with the solar cells using hard substrates such as glass substrates.

Known flexible substrates include those of polyethylene terephthalate films commonly called by the name of "PET films" and polyimide films. The general use PET films are low cost and readily available, and are characterized by their relatively small linear expansion coefficient of about $3 \times 10^5$ /°C. Furthermore, because they transmit light, PET films can be used in the same manner as the glass substrates for fabricating thin solar cells of a type in which the incident light is introduced from the substrate side.

A thin film solar cell can be fabricated by a known process using a PET film in the same manner as a one using a glass substrate. That is, an amorphous silicon (denoted generally as "a-Si") semiconductor is deposited on the substrate by a chemical vapor reaction process. In such a process, the temperature of the substrate must be maintained low because a PET film, as well as an organic resin film, has poor thermal resistance.

As described in the foregoing, care had been taken in using an organic resin film such as a PET film in a known process for fabricating thin film solar cells so that the substrate temperature may not become excessively high, because heat is fatal to a plastic film. However, when a transparent conductive film such as an ITO (Indium-Tin-Oxide) is deposited by sputtering on a substrate made of, e.g., a PET film, the surface of the film becomes hot due to the sputtered ITO particles that hit the surface even though the film is not externally heated. As a result, the unreacted starting materials, fillers, UV absorbers, etc., which had been included in the PET film precipitate as oligomers to form irregularities on the surface of the film. An oligomer is a polymer having a lower polymerization degree, and has a melting point or a softening point lower than that of polyethylene terephthalate which constitutes the PET film.

Furthermore, the substrate should be heated on depositing an amorphous silicon semiconductor by plasma CVD (chemical vapor deposition) to establish the photoelectric conversion layer. This step somewhat enhances growth of the oligomer having precipitated on the film by depositing the ITO film above, thereby leaving film irregularities being grown to a size of about 1 μm.

As is well known, the amorphous silicon semiconductor layer (generally having a PIN structure) which corresponds to the photoelectric conversion layer is deposited at a thickness of from about 0.2 to 1 μm. It can be seen therefore that the amorphous silicon film is greatly influenced by the irregularities which generate with the precipitation of the oligomers. This severely impairs the conversion efficiency because the thickness of the photoelectric conversion layer remains no longer constant.

Referring to an example as shown in FIG. 2, the effect of the precipitated oligomer on the structure of a thin film solar cell is explained. The figure shows schematically a cross sectional view of a solar cell, which was constructed based on a micrograph obtained by SEM (scanning electron microscopy) and an analysis using SIMS (secondary ion mass spectroscopy).

In FIG. 2, there is shown a structure comprising a 100 μm thick organic resin film substrate, i.e., a PET film substrate 20, having deposited thereon a 4,000 Å thick ITO electrode 22 and a 4,500 Å thick photoelectric conversion layer 23 composed of an amorphous silicon having a PIN structure in this order from the substrate side. An aluminum back electrode 24 is established at a thickness of 3,000 Å. Spherical oligomers 21 about 1 μm in diameter are incorporated between the PET film 20 and the photoelectric conversion layer 23. It can be seen clearly from the figure that the oligomers as large as 1 μm in diameter greatly affect both the pair of electrodes and the photoelectric conversion layer. The presence of such oligomers causes the thickness of the photoelectric conversion layer 23 to fluctuate, and it thereby lowers the conversion efficiency. Furthermore, because the oligomers grow to penetrate the first electrode on the substrate, the incorporation of a plurality of oligomers causes an increase in resistivity of the first electrically conductive film. This is also another problem to be solved. Moreover, it tends to become complicated on taking an integrated structure by connecting and separating the electrodes.

As described above, the thin film solar cell which is obtained on an organic resin substrate suffered lower conversion efficiency as compared with a photoelectric conversion device established on a glass substrate, because in the former, the presence of the oligomers which precipitate on depositing the transparent electrode and which develop during the deposition of an amorphous silicon layer considerably impaired the efficiency.

In general, the film deposition temperature is of great concern in depositing a thin amorphous silicon film by plasma CVD on an organic resin substrate. It is known that a substrate temperature in the range of from about 100° to 300 ° C. is optimal in depositing amorphous silicon on a glass substrate. Accordingly, a substrate temperature of 100° C. or higher is assumably favorable for depositing a thin amorphous silicon film on a PET film. However, the thermal expansion of the PET film then arises as another problem in depositing the film at high temperatures.

More specifically, an amorphous silicon film tends to fall off, or cracks generate on the substrate when the substrate undergoes thermal expansion. This problem occurs not only on PET films, but also on all organic resin films which are used as substrates in fabricating semiconductor devices. The problem above can be well understood by considering, as mentioned hereinbefore, the fact that a PET film has a relatively small thermal expansion coefficient among the organic resin films.

Furthermore, even when the problem of thermal expansion is overcome by some means, the problem of growing oligomers is yet to solve; the oligomers having precipitated with the film deposition of the transparent conductive films grow during the deposition of the thin film amorphous silicon.

As mentioned in the foregoing, a conventional process of depositing amorphous silicon on a PET film by plasma CVD process suffered two problems, i.e., one is the problem of the oligomers which inevitably precipitate from the PET film, and the other is the problem of the thermal expansion of the PET film. Consequently, the film deposition temperature had been determined optimally by taking the both problems into account.

Conventional organic resin substrates in general contain fillers. The fillers function as a reinforcing material or enable the organic resin substrate to easily pass through the rollers. The addition of such fillers, however, forms irregularities on the surface of the resin substrate. Accordingly, characteristics of a photoelectric conversion device and the like which is established on such a substrate tends to be impaired by the surface irregularities of the substrate.

SUMMARY OF THE INVENTION

An object of the present invention is to provide a semiconductor device having fabricated on an organic resin substrate, free from oligomers which had inevitably generated on the surface of the substrate in conventional device structures.

Another object of the present invention is to provide a method for forming the above semiconductor device.

DETAILED DESCRIPTION OF THE INVENTION

Figure 1:
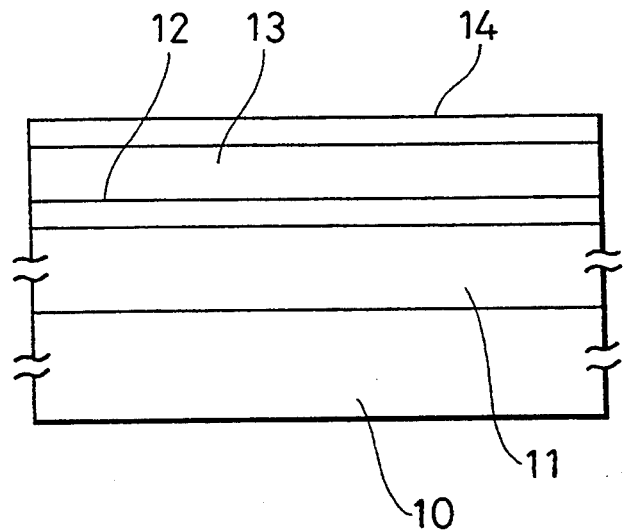
FIG. 1 is a schematically drawn cross sectional view of a photoelectric conversion device according to an embodiment of the present invention.
Figure 2:
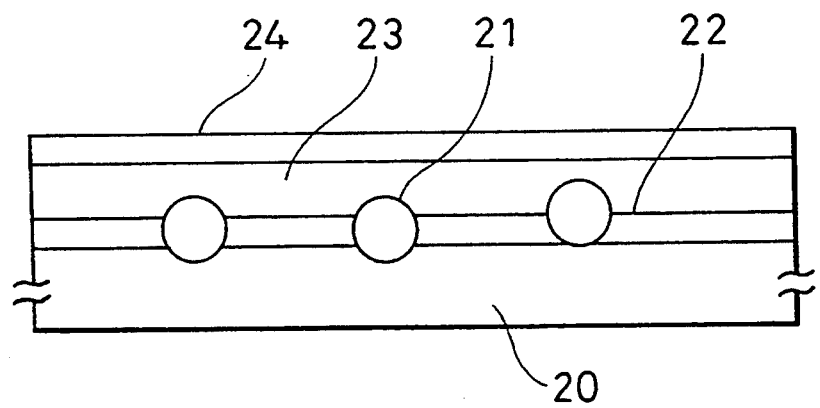
FIG. 2 is a schematically drawn cross sectional view of a conventional photoelectric conversion device.

The present invention is characterized by that it provides a semiconductor device having formed on an organic resin substrate, wherein the method for forming the device comprises coating the surface of the organic resin substrate with an organic resin coating to prevent the oligomers from being precipitated from the organic resin substrate; and forming the semiconductor device on the organic resin coating. Thickness of the organic resin coating is preferably 0.05 to 10 $\mu$m. The substrate referred herein is such made of a film of, for example, a polyester (e.g., PET (polyethylene terephthalate)), a polyimide, a fluoroplastics, a PES (polyether sulfane), and a PSF (polysulfane). Particularly preferred for the substrate are films of polyimide and fluoroplastics from the viewpoint of thermal resistance. The organic resins to be applied to the surface of the substrate include a polyimide resin, and an acrylic resin (e.g., methyl acrylate ester, ethyl acrylate ester, butyl acrylate ester, and 2-ethylhexyl acrylate ester). For example, the formation of the organic resin coating comprising an acrylic resin may be carried out by applying an acrylic ester to the substrate and subsequently hardening the acrylic ester. The acrylic ester can be hardened by an ultraviolet ray.

The present invention is accomplished based on an experimental finding; it has been found that no formation of oligomers occurs when a PET film substrate having previously coated with an acrylic resin containing an acrylate ester as the principal component is used in a photoelectric conversion device being fabricated by a conventional process.

Furthermore, a device still improved in performance can be obtained by establishing, for example, a photoelectric conversion device on a filler-added organic resin film substrate having provided previously thereon an organic resin for the purpose of increasing surface smoothness.

In particular, a remarkable improvement in device characteristics can be observed on a device by fabricating it on a polyimide film substrate having provided previously thereon a polyimide film with the purpose of levelling the initial surface irregularities. Otherwise, a device considerably improved in device characteristics can be obtained as well by establishing, e.g., a photovoltaic device, on an organic resin film substrate having previously provided thereon a coating of the same material as that of the substrate. These improvements are achieved because thermal expansion coefficient, etc., of the organic resin layer provided on the film substrate are matched to those of the film substrate by using the same material for both the organic resin layer and the substrate.

Specifically mentioned for the polyimide film substrates include KAPTON (a product of Du Pont Co., Ltd.) and Upilex (a product of Ube Industries, Ltd.). A flexible KAPTON substrate resists to a temperature of 400° C. or higher, and yields a dielectric breakdown in the range of from 200 to 500 kV/mm and a volume resistivity of from $10^{14}$ to $10^{18}$ $\Omega$·cm. A Upilex substrate is also flexible, resistant to heat, and yields a dielectric breakdown in the range of from 1 to 10 kV/mm and a volume resistivity of from $10^{15}$ to $10^{17}$ $\Omega$·cm.

A polyimide coating is formed on the surface of the polyimide film substrate by coating a polyimide precursor on the surface of the substrate, and then firing the precursor to obtain polyimide. Usable as the polyimide precursor is Semicofine produced by Toray Industries, Inc. Semicofine contains few metal ions and provides a smooth film having a volume resistivity of from $10^{16}$ to $10^{17}$ $\Omega$·cm.

The effect of the present invention is most remarkably exhibited when PET is selected as the substrate among others including PES and PSF, because PET is the lowest in glass transition temperature and is hence most liable to form oligomers.

Useful acrylic resins are those used in hard finishing for improving resistances of plastics against wear, chemicals, and staining.

The precipitation of oligomers from organic resin films during sputtering can be mostly suppressed by coating the organic resin substrate with an acrylic resin.

The present invention is described in further detail referring to non-limiting examples. It should be understood, however, that the present invention is not construed as being limited thereto.

EXAMPLE

A thin film solar cell was fabricated using a 100 $\mu$m thick PET film, i.e., an organic resin film based on polyethylene terephthalate, as the substrate. More specifically, a T56 or T60 PET film (produced by Toray Industries, Inc.) generally used as an OHP sheet was employed. However, there is no particular limitation as to the type of PET film, and any PET film can be selected as desired. Obviously, the construction of the present invention is also effective in cases where other organic resin films are used in the place of a PET film.

Referring to FIG. 1, the structure of a thin film solar cell according to the present invention is explained. The structure comprises a 100 μm thick PET film 10 as the organic resin substrate, having formed thereon subsequently in this order, an acrylic resin layer 11, a transparent electrically conductive ITO film 12 as a first electrode, a photoelectric conversion layer 13 made of amorphous silicon semiconductor and having a PIN structure in this order from the substrate side, and an aluminum electrode 14 as a second electrode. In this thin film solar cell, the incident light enters the device from the substrate side.

The structure shown in FIG. 1 is the most basic unit of a thin film solar cell. However, the integration process and the structure of the photoelectric conversion layer are not referred in detail here because there is no particular limitation in the device according to the present invention. Accordingly, the semiconductor for the photoelectric conversion layer can be of any type, and may be selected appropriately considering the thermal resistance of the substrate.

The fabrication process for the semiconductor device according to an embodiment of the present invention is described below. A 100 μm thick PET film 10 for use as an organic resin film substrate was coated with an acrylic resin 11 based on an acrylate ester (trade name: Aronix UV-3700, a product of Fuji Kagaku Sangyo KK) to a thickness of 7 μm. This acrylic resin is of a type which is generally used for protecting the surface of plastics. Thus, the PET film was coated with Aronix UV-3700 using a spinner, and then cured using an ultraviolet (UV) light to obtain a coating in the thickness range of from 0.05 to 10 μm. It should be noted, however, that too thin a coating has small effect. Then, a 4,000 Å thick ITO was deposited as a transparent conductive film 12 on the resulting structure using a known RF sputtering, without heating the substrate. No oligomers were found to generate at this state. It has been thus confirmed that coating the surface of the substrate with an acrylic resin is effective for preventing formation of oligomers.

An amorphous silicon semiconductor layer having a PIN arrangement from the substrate side (the side of light incidence) was further deposited as a photoelectric conversion layer on the transparent conductive layer 12 thus obtained. The amorphous silicon semiconductor layer was deposited by a known plasma CVD process, to obtain a structure composed of a 100 Å thick P-type semiconductor layer provided on the first electrode, a 4,000 Å thick intrinsic semiconductor layer provided on the P-type semiconductor layer, and a 400 Å thick N-type semiconductor layer provided on the intrinsic semiconductor layer. The substrate temperature was maintained at 100° C. throughout the film deposition by taking the thermal resistance of the substrate into account. The temperature, however, may be selected as desired in the range of from room temperature to 180° C.

The structure and the process for fabricating the photoelectric conversion layer are not particularly limited, and any structure and process may be selected according to particular requirements.

A back electrode 14 was then established by depositing aluminum to a thickness of 3,000 Å using a vacuum evaporation process. The material for the back electrode is not only limited to aluminum, but other materials such as silver (Ag), chromium (Cr), nickel (Ni), molybdenum (Mo), and SUS stainless steel may be used as well.

Furthermore, though not shown in the Figure, a protective film is generally provided on the structure using a resin and the like. In addition, it should be noted that ordinary solar cell systems are constructed by integrating a number of photoelectric conversion elements (minimum unit of solar cell). Accordingly, there exist many types of system configuration. However, such configurations are not directly related with the device of the present invention and are not referred herein.

The device characteristics of the photoelectric conversion devices fabricated as an Example and a Comparative Example are given in Table 1 below. The device of the Comparative Example is a photoelectric conversion device obtained by a process similar to that described in the Example above, except for omitting the step of coating a PET film with an acrylic resin. Accordingly, the structures for the devices are the same except that an acrylic resin coating is not provided on the PET film of the device of the Comparative Example.

TABLE 1

|  | $I_{SC}$ | $V_{OC}$ | FF | $E_{FF}$ |
|---|---|---|---|---|
| Example | 11.28 | 0.763 | 0.513 | 4.34 |
| Comparative Example | 12.11 | 0.680 | 0.449 | 3.70 |

It can be seen from Table 1 that the photoelectric conversion device having an acrylic resin coating on the PET film according to the present invention yields a higher yield and an improved conversion efficiency as compared with those of the device having no acrylic coating on the PET film (Comparative Example).

Figure 3:
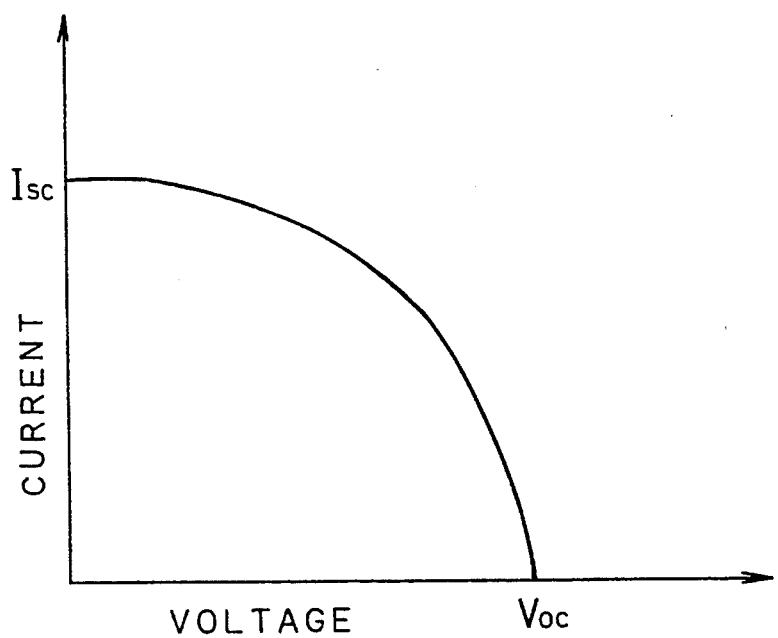
FIG. 3 shows a voltage-current characteristic of a photoelectric conversion device.

In Table 1 and FIG. 3, $I_{sc}$ is a short circuit current in mA, $V_{oc}$ is an open circuit voltage in V, FF is a curve factor, and $E_{FF}$ is a conversion efficiency. The device characteristics given in Table 1 are obtained by averaging the data collected on the samples under a condition of AM-1.0 100 mW/cm$^2$.

As described in the foregoing, the present invention provides a photoelectric conversion device having an acrylic resin coating provided on the surface of an organic resin film substrate to suppress the formation of oligomers during the fabrication of a device using an organic resin substrate. Accordingly, photoelectric conversion devices being improved in conversion efficiency are provided at a high yield.

Furthermore, the device according to the present invention is lowered in the formation of oligomers that further development of oligomers during the heating of the substrates need not be considered. Hence, the steps of film deposition and the like can be conducted by simply taking the problem of thermal expansion during substrate heating into account.

One of the problems which had been long faced in fabricating a semiconductor device on an organic resin substrate was eliminated. Thus, the device fabrication can be conducted under a wider range of conditions; in particular, the film deposition temperature can be more freely selected.

The present invention can be applied to not only photoelectric conversion devices, but also to a variety of semiconductor devices which are established on an organic resin substrate, such as light-emitting elements, switching elements, and sensors.

While the invention has been described in detail and with reference to specific examples thereof, it will be apparent to one skilled in the art that various changes and modifications can be made therein without departing from the spirit and scope thereof.

What is claimed is:

1. A method for forming a semiconductor device comprising the steps of:
   forming an organic resin coating on an organic resin substrate; and
   forming a layer for said semiconductor device on said organic resin coating,
   wherein said organic resin coating comprises an acrylic resin.

2. The method of claim 1 wherein said organic resin coating is formed by applying an acrylic ester to said substrate and subsequently hardening said acrylic ester.

3. The method of claim 2 wherein said acrylic ester is hardened by an ultraviolet ray.

4. The method of claim 1 wherein said substrate is made of a material selected from the group consisting of polyethylene terephthalate, polyether sulfane and polysulfane.

5. The method of claim 1 wherein said substrate is made of polyester.

6. The method of claim 1 wherein said semiconductor device forming step is carried out by forming a first electrode on said organic resin coating, forming a p-type semiconductor layer on said first electrode, forming an intrinsic semiconductor layer on said p-type semiconductor layer, forming an n-type semiconductor layer on said intrinsic semiconductor layer, and forming a second electrode on said n-type semiconductor layer.

7. The method of claim 6 wherein the formation of said first electrode is carried out by sputtering.

8. The method of claim 2 wherein said substrate is made of a material selected from the group consisting of polyethylene terephthalate, polyether sulfane and polysulfane.

9. The method of claim 1 wherein said layer comprises a conductive material directly deposited on said organic resin coating by sputtering.

10. The method of claim 1 wherein said semiconductor device is a photoelectric conversion device or a switching element.

11. A method for forming a semiconductor device comprising the steps of:
    preparing a substrate comprising a material selected from the group consisting of polyester, polyimide, fluoroplastics, polyether sulfane, and polysulfane;
    providing a surface of said substrate with an organic resin buffer film selected from the group consisting of polyimide resin and acrylic resin; and
    fabricating said semiconductor device on a surface of said buffer film.

12. The device of claim 11 wherein said step of fabricating includes at least a step of forming a layer on said buffer film by sputtering or CVD.

13. The method of claim 12 wherein said layer comprises a conductive material directly deposited on said organic resin coating by sputtering.

14. The method of claim 11 wherein said semiconductor device is selected from the group consisting of photoelectric conversion device and a switching element.

15. A method of forming a semiconductor substrate comprising the steps of:
    preparing a substrate comprising PET;
    forming an acrylic resin coating on said substrate; and
    forming said semiconductor device on said acrylic resin coating.

16. The method of claim 15 wherein said semiconductor device includes at least one layer formed on said acrylic resin coating by sputtering or CVD.

17. The method of claim 16 wherein said layer is an electrode directly deposited on said acrylic resin coating by sputtering.

18. The method of claim 16 wherein said substrate is not intentionally heated during the formation of said layer.

* * * * *